(12) United States Patent
Wagner et al.

(10) Patent No.: US 6,389,566 B1
(45) Date of Patent: *May 14, 2002

(54) EDGE-TRIGGERED SCAN FLIP-FLOP AND ONE-PASS SCAN SYNTHESIS METHODOLOGY

(75) Inventors: Kenneth D. Wagner, Sunnyvale; Srinivasan R. Iyengar, Fremont; Mehran Amerian, Campbell, all of CA (US)

(73) Assignee: S3 Incorporated, Santa Clara, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/088,754

(22) Filed: Jun. 2, 1998

(51) Int. Cl.$^7$ ................................. G01R 31/28
(52) U.S. Cl. ........................ 714/726; 327/202
(58) Field of Search ................. 714/726, 727, 714/729, 3, 718, 733, 724, 8; 712/726, 727, 729; 361/782; 327/202, 201, 217, 210, 203, 208, 211–212, 218; 365/200, 726, 727; 364/578; 395/500.4

(56) References Cited

U.S. PATENT DOCUMENTS

| 4,495,629 A |   | 1/1985  | Zasio et al. ............... 377/70      |
| 4,588,944 A |   | 5/1986  | Rothenberger ............ 714/731        |
| 4,937,770 A | * | 6/1990  | Samuels et al. ............ 364/578      |
| 5,329,471 A | * | 7/1994  | Swoboda et al. ........ 395/500.44       |
| 5,452,239 A | * | 9/1995  | Dai et al. ................. 395/500.4   |
| 5,625,567 A |   | 4/1997  | Mankin et al. ......... 395/500.04       |
| 5,629,838 A | * | 5/1997  | Knight et al. ............. 361/782      |
| 5,633,606 A | * | 5/1997  | Gaudet et al. ............. 327/202      |
| 5,636,228 A |   | 6/1997  | Moughanni et al. ........ 714/726        |
| 5,654,658 A |   | 8/1997  | Kubota et al. ............ 327/202       |
| 5,684,808 A |   | 11/1997 | Valind                                   |
| 5,703,789 A |   | 12/1997 | Beausang et al. ....... 395/500.05       |
| 5,706,296 A | * | 1/1998  | Whetsel ..................... 714/726    |
| 5,715,171 A |   | 2/1998  | Mori et al. ............. 395/500.19     |
| 5,790,771 A | * | 8/1998  | Culbertson et al. ............ 714/3     |
| 5,805,197 A | * | 9/1998  | Fleming et al. ............. 347/237     |
| 5,847,561 A | * | 12/1998 | Whetsel ................... 324/158.1    |
| 5,859,657 A | * | 1/1999  | Donahue et al. ............ 347/237      |
| 5,859,860 A | * | 1/1999  | Whetsel ..................... 714/727    |
| 5,872,908 A | * | 2/1999  | Whetsel ..................... 714/726    |
| 5,898,703 A | * | 4/1999  | Lin ........................... 714/726  |
| 6,055,659 A | * | 4/2000  | Whetsel ..................... 714/726    |

FOREIGN PATENT DOCUMENTS

| EP | 0702 242 A2 |   | 3/1996 | ....... G01R/31/3185 |
| EP | 0702242 A2  | * | 3/1996 | ....... G01R/31/3173 |
| EP | 0709 688 A1 |   | 5/1996 | ....... G01R/31/3185 |

OTHER PUBLICATIONS

Boyle, et al., Jan. 5, 1988, U.S. Pat. No. 4,718,065 (Abstract only).
Rosales, Jul. 21, 1992, U.S. Pat. No. 5,132,974 (Abstract only).
Maeno, Mar. 23, 1993, U.S. Pat. No. 5,197,070 (Abstract only).

(List continued on next page.)

Primary Examiner—Albert Decady
Assistant Examiner—Guy J. Lamarre
(74) Attorney, Agent, or Firm—Christie, Parker & Hale, LLP

(57) ABSTRACT

An improved scan flip-flop and method of using same. The scan flip-flop has a separate dedicated scan output driven by a scan output signal driver. Scan shift race conditions are minimized by providing a weak scan output signal driver and inserting delay elements within a cell for a scan flip-flop in the scan signal path. The use of the improved scan flip-flop allows for a one-pass scan synthesis process which provides accurate flip-flop cell timing and area information during the design process.

27 Claims, 6 Drawing Sheets

OTHER PUBLICATIONS

Ozaki, Aug. 9, 1994, U.S. Pat. No. 5,337,321 (Abstract only).
Koo, et al., Jan. 31, 1995, U.S. Pat. No. 5,386,423 (Abstract only).
Sturges, Feb. 13, 1996, U.S. Pat. No. 5,491,666 (Abstract only).
Meltzer, Aug. 6, 1996, U.S. Pat. No. 5,544,173 (Abstract only).
Nakata, Dec. 24, 1996, U.S. Pat. No. 5,588,008 (Abstract only).
Gaudet, et al., May 27, 1997, U.S. Pat. No. 5,633,606 (Abstract only).
Moughanni, et al., Jun. 3, 1997, U.S. Pat. No. 5,636,228 (Abstract only).
Read, et al., Sep. 30, 1997, U.S. Pat. No. 5,673,295 (Abstract only).
Valind, Nov. 4, 1997, U.S. Pat. No. 5,684,808 (Abstract only).
Greenstein, et al., Dec. 2, 1997, U.S. Pat. No. 5,694,403 (Abstract only).
Angelotti, et al., Feb. 10, 1998, U.S. Pat. No. 5,717,701 (Abstract only).
Gillis, et al., Feb. 17, 1998, U.S. Pat. No. 5,719,879 (Abstract only).

* cited by examiner

EDGE-TRIGGERED SCAN FLIP-FLOP AND ONE-PASS SCAN SYNTHESIS METHODOLOGY

BACKGROUND OF THE INVENTION

This invention relates generally to the design of digital integrated circuits, and more specifically to an improved edge-triggered scan flip-flop and one-pass scan synthesis method.

The use of integrated circuits is widespread and pervasive. Integrated circuits implement complex logic operations, and often do so through the use of an exceedingly large number of logic gates. A significant concern in the design and testing of integrated circuits is that the integrated circuit, often comprising well over one million logic gates, implements specified logic operations without error.

Ideally, every possible combination of inputs to an integrated circuit is applied when the integrated circuit is in every possible internal logic state, thus allowing every possible output of the circuit to be compared with the functional requirements of the circuit. However, even for a combinational circuit, which is a circuit in which the outputs of the circuit depend directly on the inputs to the circuit, and which thereby does not contain memory elements, the number of possible input combinations is sufficiently large that the test of the circuit becomes an NP hard problem, that is one that cannot be solved in polynomial time. For a sequential circuit, which is a circuit that contains internal memory and thus may have a number of internal logic states, the problem of testing every conceivable input combination in every combination of logic states of the circuit becomes even more intractable.

Further, testing of the circuit by manipulating the primary inputs and examining the primary outputs provides little information as to a location of a fault within the circuit. The knowledge that a certain combination of inputs to a circuit results in an incorrect combination of outputs from the circuit may be of little use in determining where in the circuit the error occurs.

One method known in the art of providing additional detail as to the internal operation of the circuit is to replace flip-flops normally found in the circuit with scan flip-flops. Generally speaking, almost any flip-flop present in a circuit may be converted to a scan flip-flop. Often a non-scan flip-flop is made scannable by adding a scan data input which is passed to a flip-flop output through the use of either a multiplexer and associated control signal or an independent clock. Such modifications increase circuit area and power requirements, and may otherwise affect circuit operation.

A scan flip-flop may be used as a control point for inserting a value into a circuit, or as an observation point for observing a value at a point in the circuit. Scan flip-flops are generally tied, or stitched, together to form a scan chain, with the scan chain forming a serial shift register. Data may be shifted in to provide input values for the circuit, or shifted out to capture the state of a portion of the circuit.

FIG. 1 illustrates a digital logic circuit. The digital logic circuit includes combinational circuit elements 11, 13. Scan flip-flops 15A–G are dispersed about the combinational circuit elements 11, 13. Each of the scan flip-flops 15A–G has four input ports for receiving associated input signals and one output port for outputting an associated output signal. The input ports are a data-in input port ($D_{IN}$), a scan-in input port ($S_{IN}$), a clock input port (CLK), and a test mode signal input port ($\overline{N/T}$). Each of the scan flip-flops has a single data-out output port (Q). The output Q is set to $D_{IN}$ after the rising edge of the clock signal when the test mode signal is set to a $\overline{\text{TEST}}$ value. Thus, when the test mode signal is set to $\overline{\text{TEST}}$ the scan flip-flop acts as an edge-triggered flip-flop. When the test mode signal is set to $\overline{\text{TEST}}$, however, the output signal Q is set to $S_{IN}$ after the rising edge of the clock signal. Thus, the scan flip-flops are edge-triggered flip-flops made scannable by adding a scan input and a multiplexer with an associated control signal.

In the digital logic circuit of FIG. 1, the combinational circuit 11 has at least four outputs 17A–D, each of which is passed to the $D_{IN}$ ports of the scan flip-flops 15A–D, respectively. The combinational circuit 13 has at least four inputs 19A–D, which are provided by the Q data output ports of the scan flip-flops 15A–D, respectively. The combinational circuit 13 also has at least three outputs 17E–G, which are connected to the $D_{IN}$ ports of the flip-flops 15E–G, respectively. All of the scan flip-flops 15A–G are provided a common clock CLK signal 21 and a common test mode $\overline{N/T}$ signal 23.

The scan flip-flops 15A–G are formed into a serial scan chain, i.e., a serial shift register, by connecting the Q data output of one scan flip-flop to the $S_{IN}$ port of another scan flip-flop. Accordingly, in addition to connecting the Q data output 19A of scan flip-flop 15A to the combinational circuit 13, the Q data output 19A is also connected to the $S_{IN}$ scan input port of scan flip-flop 15B. Similarly, the Q data output 19B is connected to the $S_{IN}$ input port of scan flip-flop 15C, the Q data output 19C is connected to the $S_{IN}$ input port of scan flip-flop 15D, the Q data output 19D is connected to the $S_{IN}$ input port of scan flip-flop 15E, the Q data output 19E is connected to the $S_{IN}$ input port of scan flip-flop 15F, and the Q data output 19E is connected to the $S_{IN}$ input port of scan flip-flop 15G. In the circuit of FIG. 1, the $S_{IN}$ input 20 to scan flip-flop 15A is accessible by a circuit tester, and the Q data output 19G of scan flip-flop 15G is readable by the circuit tester. Accordingly, the scannable flip-flops 15A–G are stitched together to form a serial chain in the order of 15A–15B–15C–15D–15E–15F–15G.

The scan flip-flops act both as control points and observation points. Control points, of course, may be treated as pseudo-primary inputs (PIs) and observation points may be treated as pseudo-primary outputs (POs). By way of example, for the circuit of FIG. 1 the scan flip-flops 15A–G are first treated as pseudo-PIs and are provided an input test vector comprised of state bits. The input test vector is provided by setting the test mode signal to $\overline{\text{TEST}}$ and sequentially placing input data on the $S_{IN}$ line 20 every clock cycle. The first clock cycle after the input data is placed on the $S_{IN}$ line shifts the input data to the $S_{IN}$ input of the next scan flip-flop in the scan chain. Accordingly, by sequentially placing data on the scan in line 20 on sequential clock cycles, each of the scan flip-flops in the scan chain may be loaded with a state bit from the test vector. Thereafter setting the test mode signal to $\overline{\text{TEST}}$ allows for normal circuit operation, with the circuit utilizing the data input to the scan flip-flops as pseudo-primary outputs. After providing the circuit one or more (usually one) clock pulses to drive the system to an expected desired state the test mode signal is again set to $\overline{\text{TEST}}$. Thereafter providing clock signals to the circuit causes the data present on the output ports of the scan flip-flops to be sequentially shifted to the next scan flip-flop in the scan chain, with the data being read from output 19G by a tester.

Proper operation of the scan chain therefore generally requires that the scan shift chain operate in a race-free manner. If a race condition exists then the data in the scan chain may be corrupted and provide either an incorrect test vector or an incorrect indication of system state. For example, during a scan data shift operation an edge of the clock signal may reach scan flip-flop 15D a period of time prior to the edge of the clock signal reaching scan flip-flop 15E. If the period of time is sufficiently long, the input to the scan flip-flop 15D may be passed through the scan flip-flop 15D and propagated to the scan flip-flop 15E before the data previously at the input to scan flip-flop 15E is passed to the next scan flip-flop in the scan chain. The data previously at the input to scan flip-flop 15E would thereby be overwritten by the input to scan flip-flop 15D, with the result of either an incorrect test vector being loaded into the scan chain or an inaccurate reading of the system state being provided.

Furthermore, digital logic circuits are often designed using non-scan flip-flops which are later replaced, often automatically, with an equivalent scan flip-flop. The equivalent scan flip-flop is expected to substantially behave the same as the non-scan flip-flop it replaces, although this may not always be the case. This presents several problems. First, there may not be a one-to-one correspondence between non-scan flip-flops and scan flip-flops. That is, a single flip-flop may have different suitable scan equivalent flip-flops depending on the design constraints leading to the selection of any particular flip-flop. Second, the replacement of a non-scan flip-flop with a scan equivalent flip-flop may introduce variances from the timing, area and power constraints of a particular portion of a circuit. Additionally, the automatic replacement of non-scan flip-flops with scan flip-flops hides details of circuit operation from the circuit designer, increasing the difficulty of the design task. Finally, any replacement of a flip-flop chosen by the designer during initial design tasks, as well as later scan chain stitching may cause unexpected circuit timing, area, loading, or other impacts, creating a need for the designer to revisit the design late in the design cycle.

SUMMARY OF THE INVENTION

The present invention therefore provides a scan flip-flop and methodology which reduces the possibility, among other items, of race problems during scan shift operations and which provides circuit designers additional control over circuit design elements. According to the present invention a scan flip-flop is provided having a data-in signal input, a scan-in signal input, and a test signal input. A scan flip-flop also has a data-out signal output and a scan-out signal output, with a data-out driver and a scan-out signal driver forming these outputs. When a test mode signal is of a first value the scan-out signal and the data-out signal are coupled to the data-in signal. When the test mode signal is a second value the data-out signal and the scan-out signal are coupled to the scan-in signal. In one embodiment, the scan-out signal driver is a weak current source and is therefore a weak signal driver. In the same or in another embodiment, a circuit element, which may be a buffer, an inverter, or other simple logic gates, is inserted in the signal path prior to the scan-out signal driver to introduce delay in the scan-out signal path. In both cases, a substantially constant and predictable load is presented on the data-out signal path.

The scan flip-flop from the present invention may also comprise a multiplexer which sets a multiplexer output based on either a data input or a scan input depending on the value of a control input. The output of a multiplexer is coupled to a transfer gate having an input and an output, with a clock control signal setting the transfer gate output to the transfer gate input. A latch with an input and an output holds the gated transfer gate output. The value held by the latch is provided to a data-out signal driver having an input and an output, with the output providing the data output for the circuit. The output of the data-out signal driver is also provided to a scan-out signal driver having a small current drive capability.

The present invention also provides a process of designing digital logic circuits with race-free scan shift change using one-pass scan synthesis. In such a process a circuit designer designs digital logic circuits having flip-flops. The flip-flops are scan flip-flops having separate data outputs and scan outputs, with the load on the scan output not affecting drive characteristics of the data output signal.

A digital electronic circuit with scan flip-flops elements may therefore be designed by providing a high level language description representing the digital electronic circuit. A list of logic components and interconnections between the logic components is generated from the high level language description, the list of logic components including a plurality of flip-flop components. The logic components are mapped to cells, with each cell specifying a specific electronic circuit component. The flip-flop components are mapped to at least one scan flip-flop cell. The scan flip-flop cell has at least two inputs, a data input and a scan input, and at least two outputs, a data output and a scan output. Each of the data output and the scan output is driven by a signal driver, with the scan output signal driver being a weak signal driver. In another embodiment, a circuit delay element is placed in the scan-in signal path.

Many of the attendant features of this invention will be more readily appreciated as the same becomes better understood by reference to the following detailed description considered in connection with the accompanying drawings.

DETAILED DESCRIPTION OF THE INVENTION

Figure 2:
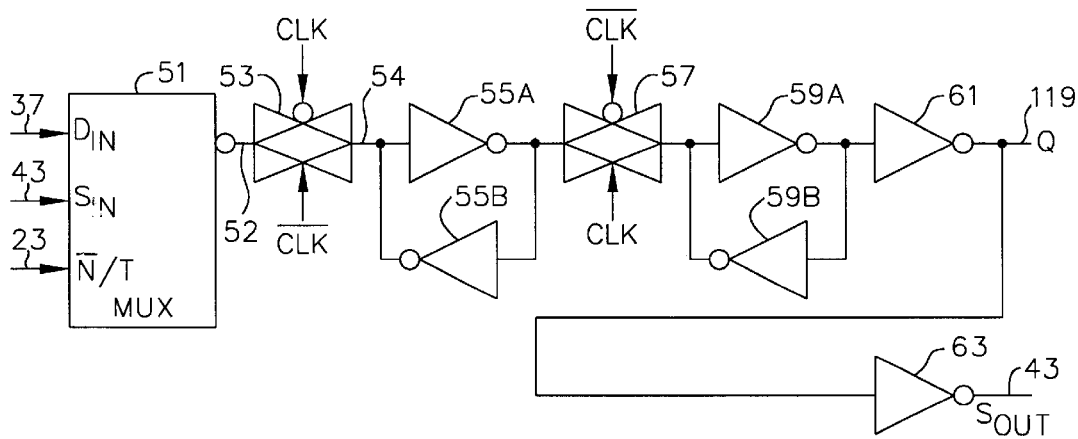
FIG. 2 illustrates a block diagram of a scan flip-flop of the present invention.

FIG. 2 illustrates a scan flip-flop of the present invention. A scan flip-flop has a multiplexer 51 with $D_{IN}$ 37, $S_{IN}$ 43 and test mode signal $\overline{N}/T$ 23 inputs. The multiplexer has a single output. The output of the multiplexer is set to $D_{IN}$ when the test mode signal is set to $\overline{TEST}$, and the output of the multiplexer is set to $S_{IN}$ when the test mode signal is set to TEST. The output of the multiplexer is connected to an input of a transfer gate 53. The transfer gate 53 also receives a clock signal (CLK) the complement of the clock signal ($\overline{CLK}$). The complement of the clock signal is generally internally generated by elements included in a cell containing the scan flip-flop, and methods for doing so are well known in the art. The cell need not, however, contain such elements, with the complement of the clock signal instead formed outside the cell containing the scan flip-flop. On a rising edge of the clock signal the input to the transfer gate is passed to an output 54 of the transfer gate. The output of the transfer gate is connected to an input of a latch 55. The latch 55 is comprised of a feed forward inverter 55A and a parallel weak feedback inverter 55B. The output of the latch 55 is connected to a second transfer gate 57, which also has as inputs a clock CLK signal and the complement of the clock signal. The output of the second transfer gate 57 is connected to an input of a second latch 59 comprised of a feed forward inverter 59A and a weak feedback inverter 59B. Accordingly, the transfer gate 53 and the latch 55 form a master portion of the flip-flop, and the transfer gate 57 and the latch 59 form a slave portion of the flip-flop.

An inverter 61 is connected to the output of a second latch 59. The output 119 of the inverter 61 is the data output Q of the scan flip-flop. The inverter 61 therefore functions as a data signal driver for the flip-flop.

Figure 6A:
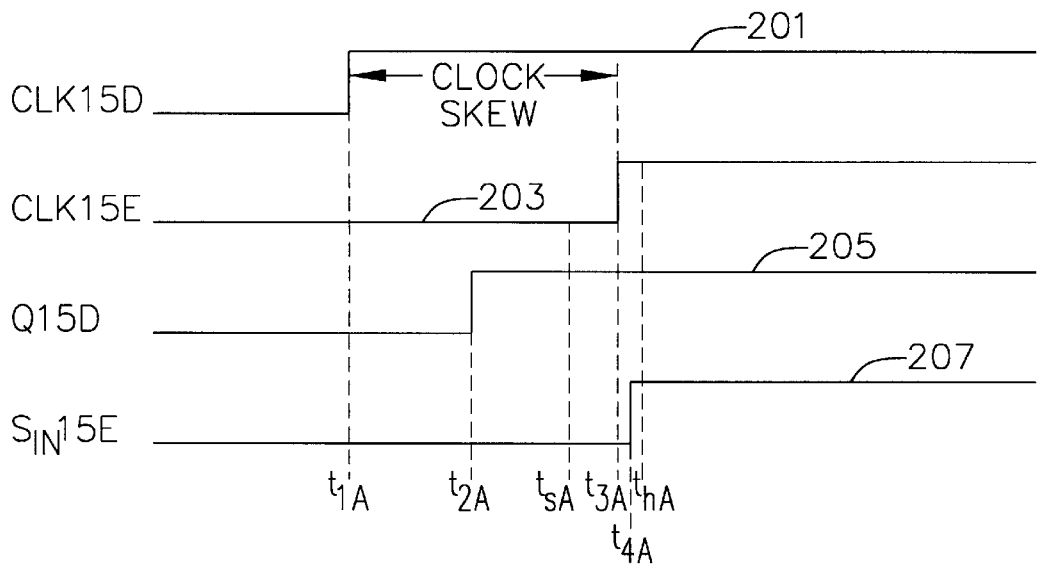
FIG. 6A illustrates a timing diagram of a scan shift operation for two scan flip-flops of the digital logic circuit of FIG. 1.

Generally, a race condition during a scan shift operation occurs when a new data value arrives at the input to a flip-flop prior to the flip-flop latching the data value previously at the input to the flip-flop. FIG. 6A illustrates a timing diagram showing a race condition during a scan shift using the digital logic circuit of FIG. 1, and specifically using the scan flip-flops 15D and 15E. At time $t_{1A}$ the rising edge of a clock signal arrives at scan flip-flop 15D. The rising edge of the clock signal causes the Q output of the scan flip-flop 15D to be set to the value of the signal at the $S_{IN}$ input. The Q output is not set to a new value, however, until time $t_{2A}$. A portion of the time period $t_{2A}-t_{1A}$ is due to signal propagation time within the scan flip-flop 15D, and a portion of the time period is due to the time required for a signal driver gate of the scan flip-flop 15D to transition the Q output to the new value.

The new Q output signal then propagates along the signal path between the Q output of scan flip-flop 15D and the $S_{IN}$ input of scan flip-flop 15E, with the new Q output signal reaching the $S_{IN}$ input of scan flip-flop 15E at time $t_{4A}$. Other circuits may also include gates along the signal path, which may cause the time period $t_{4A}-t_{2A}$ to be greater.

As illustrated in the timing diagram of FIG. 6A, the clock signal does not arrive at scan flip-flop 15D and scan flip-flop 15E at the same time due to clock skew. Instead, the clock signal arrives at scan flip-flop 15E at time $t_{3A}$, which is just prior to time $t_{4A}$. Generally, edge triggered flip-flop operation requires that an input data signal be steady from a time $t_s$, the setup time, prior to the arrival of a clock signal edge until a time $t_h$, the hold time, after the arrival of the clock signal edge. Changes to the input data signal of an edge triggered flip-flop during the $t_s$ to the window may result in an unstable or unexpected response by the flip-flop.

Accordingly, to ensure that the proper input to scan flip-flop 15E is propagated to the next scan flip-flop in the scan chain, the new Q output signal from scan flip-flop 15D must arrive at the scan flip-flop 15E after the clock signal plus any required hold time. In other words to ensure race-free operation, a scan flip-flop to scan flip-flop path must satisfy the following minimum path/hold time equation:

$$(t_w+t_g)+t_{co}+t_o>t_h+\text{clock skew};$$

where $t_w$=delay due to the wire connecting a source and destination flip-flop;

$t_g$=delay due to any gates in the signal path between the source and destination flip-flop;

$t_{co}$=delay due to signal propagation within the source flip-flop;

$t_o$=delay due to output transition time at the output of the source flip-flop;

$t_h$=hold time of destination flip-flop; and clock skew=time period between arrival of a latching clock edge to the source flip-flop and application of the latching clock edge to the destination flip-flop.

In accordance with the preceding equation, race conditions during scan shift operations may be avoided by increasing the signal transition time of a flip-flop during a shift operation. This can be accomplished by decreasing the current drive capability of the inverter 61. Decreasing the current drive capability of the inverter 61, however, also modifies circuit behavior during non-scan shift operation, and may do so in undesirable ways.

Instead, source flip-flop transition time is increased by adding a separate scan-out output port to the flip-flop. This is accomplished by connecting an inverter 63 to the output of the inverter 61. The output of the inverter 63 provides a scan-out output to the flip-flop. The inverter 63 presents a substantially known load to the inverter 61, which the circuit designer may take into account when designing a circuit.

The inverter 63 may be made a weak signal driver by decreasing its current drive capability. The current drive capability of the CMOS device is generally proportional to $\mu w/l$, where $\mu$ is the carrier mobility of the device, w is the channel width of the device, and l is the channel length of the device. For CMOS devices fabricated using 0.25 micron technology, both n-type and p-type transistors generally have a w/l ratio of approximately 8–120. For a weak signal driver, the w/l ratio is approximately 30% to 70% of the w/l ratio for a normal driver. In one embodiment using 0.25 micron technology, the weak signal driver providing the scan-out output has a w/l ratio less than 25, and preferably less than 20. The strength of the signal driver must, of course, be sufficient to drive a signal to the next flip-flop in the scan chain.

Figure 8:
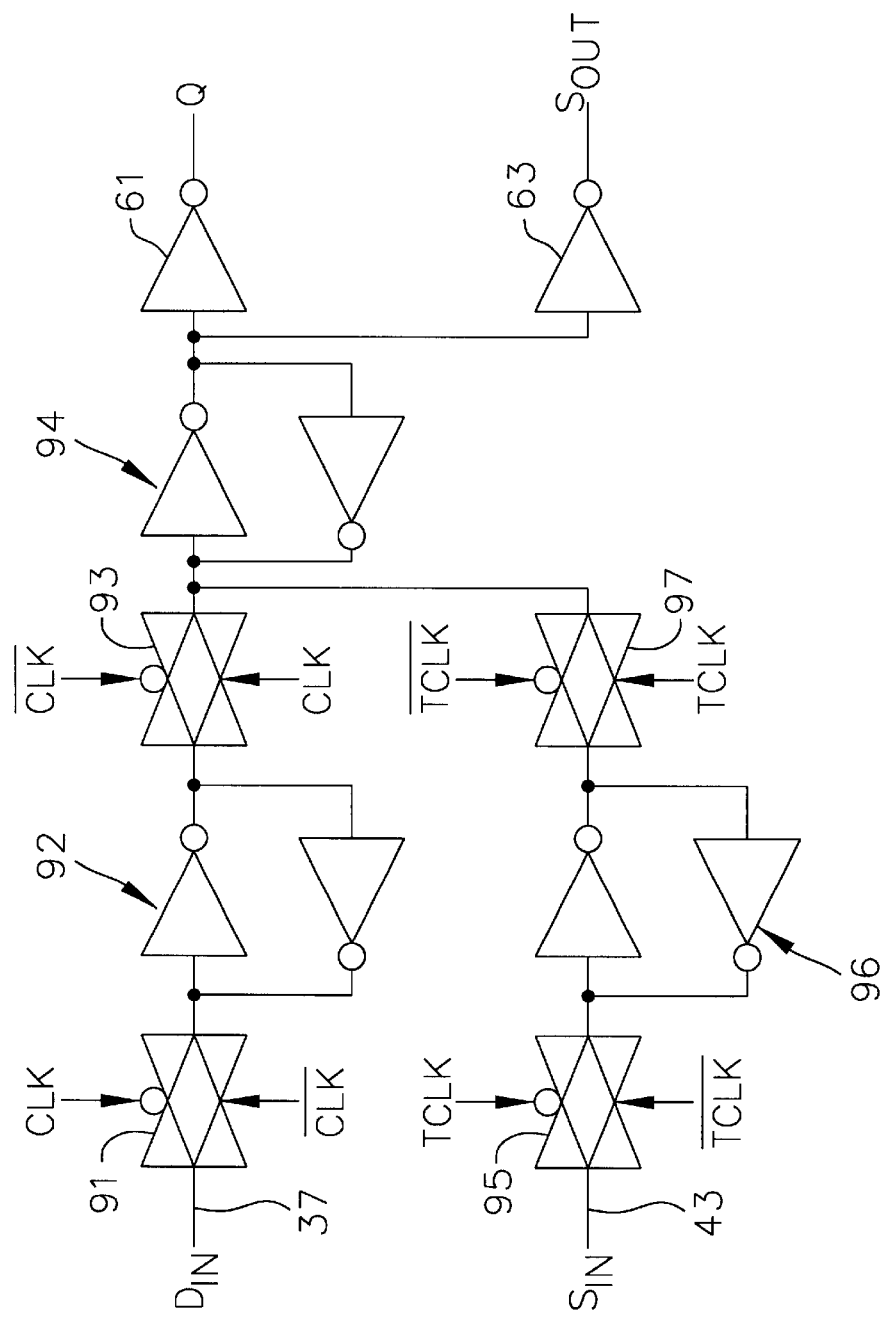
FIG. 8 illustrates a block diagram of another embodiment of a scan flip-flop of the present invention.

The scan flip-flop of FIG. 2 uses a multiplexer and associated control signal. FIG. 8 illustrates another embodiment of a scan flip-flop of the present invention which uses a test clock signal. The scan flip-flop of FIG. 8 has data-in ($D_{IN}$) 37 and scan-in ($S_{IN}$) 43 inputs. The scan flip-flop of FIG. 8 also receives a clock (CLK) signal and a test clock (TCLK) signal, with their complements generally internally generated, as with the scan flip-flop of FIG. 2, by elements included in a cell containing the scan flip-flop. The data-in input is provided to a master data-in transfer gate 91, the output of which is provided to a master data-in latch circuit 92. The output of the master data-in latch circuit is provided to a slave data-in transfer gate 93, the output of which is provided to a slave latch circuit 94. Similarly, the scan-in input is provided to a master scan-in transfer gate 95, the output of which is provided to a master scan-in latch circuit 96. The output of the master scan-in latch circuit is provided to a slave scan-in transfer gate 97, the output of which is also provided to the slave latch circuit. The output of the slave latch circuit is provided to a data-out signal driver 61 and a scan-out signal driver 63. Accordingly, the scan flip-flop of FIG. 8 behaves in a manner similar to the scan flip-flop of FIG. 2, with a primary difference being that the scan flip-flop of FIG. 8 is a two clock signal (normal clock and test clock) scan flip-flop. Additionally, in the scan flip-flop of FIG. 8 the scan-out signal driver is provided a signal from an internal node on the output data path instead of from the data-out signal driver. Providing the scan-out signal driver a signal from the internal node, instead of from the data-out signal driver, however, reduces the total signal path delay in the scan-out signal path.

Figure 3:
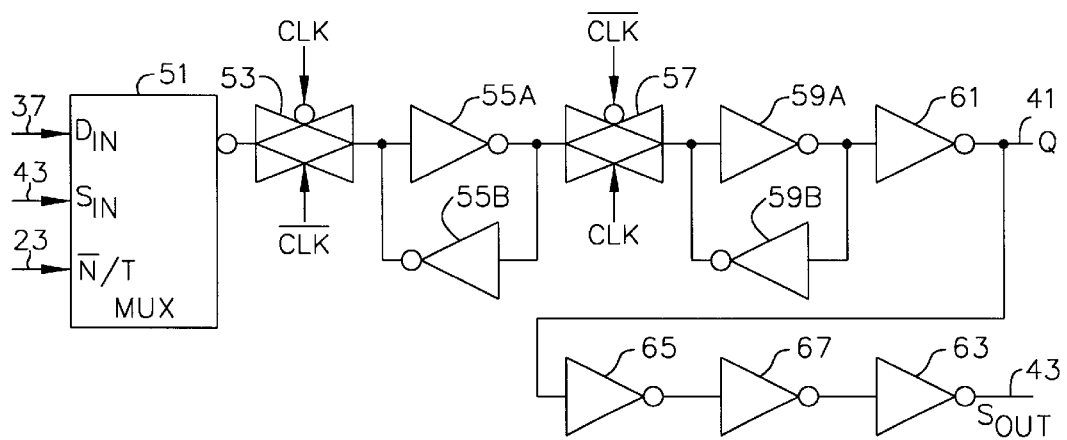
FIG. 3 illustrates a block diagram of another embodiment of a scan flip-flop of the present invention.

The possibility of a race condition during scan operation may be further reduced by increasing the propagation time $t_{co}$ of the scan-out signal within the flip-flop. FIG. 3 illustrates a scan flip-flop substantially similar to the scan flip-flop of FIG. 2. The scan flip-flop of FIG. 3, however, additionally includes a pair of inverters 65, 67. The inverters 65, 67 are placed in the signal path between the output of the data signal driver 61 and the input of the scan-out signal driver inverter 63. The inverters 65, 67 act as delay elements, delaying the propagation of the signal within the scan flip-flop. Additionally, the inverter 65, whose input is coupled to the output of the data output signal driver inverter 61, presents a substantially known load to the data signal driver inverter 61.

Thus, the scan flip-flops of FIGS. 2 and 3 provide for the decreased possibility of a race condition during scan shift operation while also decoupling the effect of scan stitching and associated wires from impacting normal circuit operation.

Figure 5:
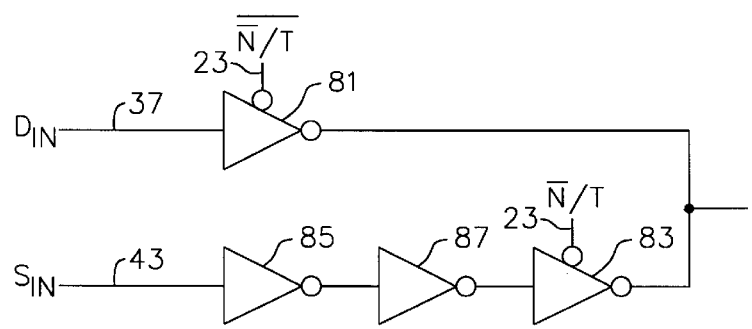
FIG. 5 illustrates a block diagram of a multiplexer of the present invention.

FIG. 5 illustrates in block form a multiplexer which may also be used to reduce the possibility of the occurrence of a race condition during a scan shift operation. The multiplexer has $D_{IN}$ 37, $S_{IN}$ 43, and test mode $\overline{N}/T$ 23 inputs. The $D_{IN}$ and $S_{IN}$ inputs are connected to inputs of gated inverters 81 and 83, respectively. The complement of the test mode $\overline{N}/T$ input is used to gate the gated inverter 81, and the $\overline{N}/T$ input is used to gate the gated inverter 83. The purpose of the gated inverters 81 and 83 is to pass the $D_{IN}$ signal, albeit inverted, to the output of the multiplexer when the test mode signal $\overline{N}/T$ is set to $\overline{TEST}$, and to pass the $S_{IN}$ signally albeit inverted, to the output of the multiplexer when the test mode signal $\overline{N}/T$ is set to $\overline{TEST}$. Alternative methods and circuits for accomplishing such a result are well known in the art, and a variety of methods and circuits could be so used. The propagation of the $S_{IN}$ signal from the input of the multiplexer to the output of the multiplexer is delayed by inverters 85 and 87 placed in the $S_{IN}$ to multiplexer signal path. As the scan flip-flop utilizes the clock signal at points in the scan flip-flop data propagation path, the inverters 85 and 87 effectively serve to decrease or make negative the hold time $t_h$ of the scan flip-flop. More specifically, the inverters cause the $t_s$–$t_h$ window of the scan flip-flop to be based on a point in time prior to receipt of the clock signal by the scan flip-flop.

Figure 1:
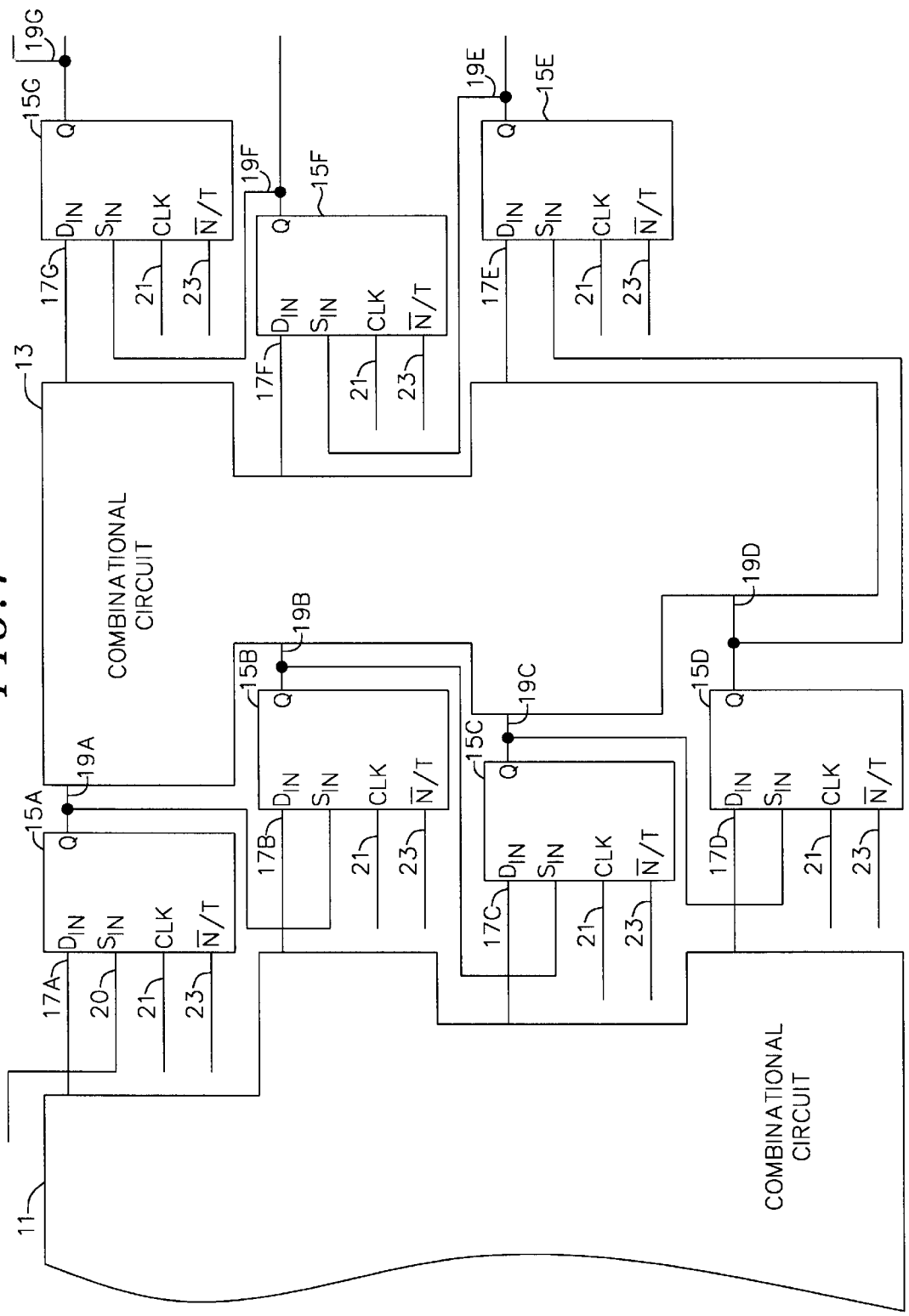
FIG. 1 illustrates a block diagram of a digital logic circuit having a scan chain.
Figure 4:
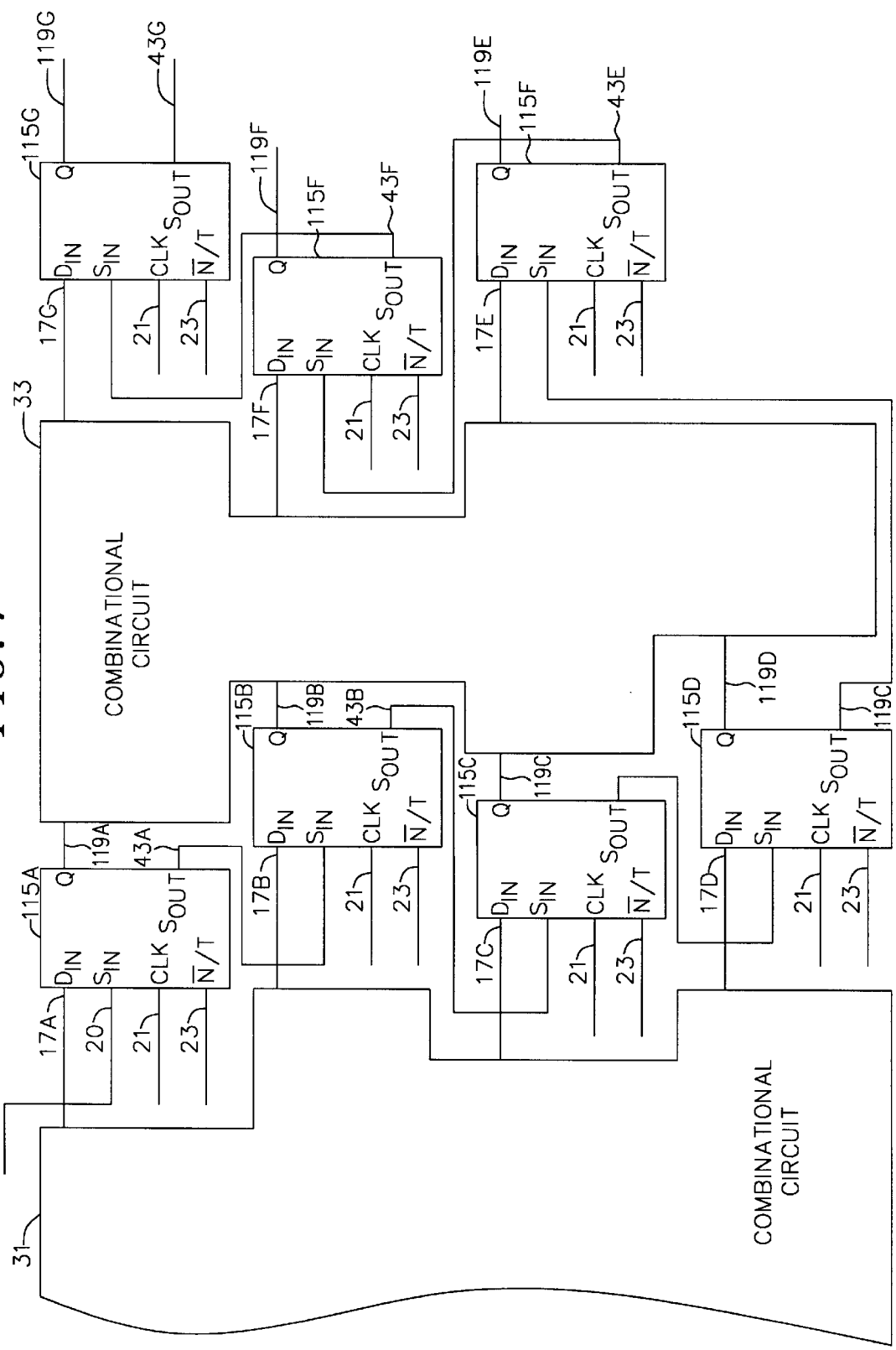
FIG. 4 illustrates a block diagram of a digital logic circuit having a scan chain utilizing the scan flip-flop of FIG. 2 or FIG. 3.

FIG. 4 illustrates the digital logic circuit of FIG. 1 with the scan flip-flops replaced with the scan flip-flops of either FIG. 2 or FIG. 3. The digital logic circuit of FIG. 2 has combinational circuit elements 31, 33 and scan flip-flops 35A–35G. The signal connection within the digital logic circuit of FIG. 2 are the same as within the digital logic circuit of FIG. 1, with the exception that the Q data output signals are no longer connected to the $S_{IN}$ input of the next scan flip-flop in the scan chain. Instead, the additional output ports $S_{out}$ of the scan flip-flop 35A–G are used to provide a signal to the $S_{IN}$ input ports of the next scan flip-flop in the scan chain and thereby stitch together the scan chain.

Figure 6B:
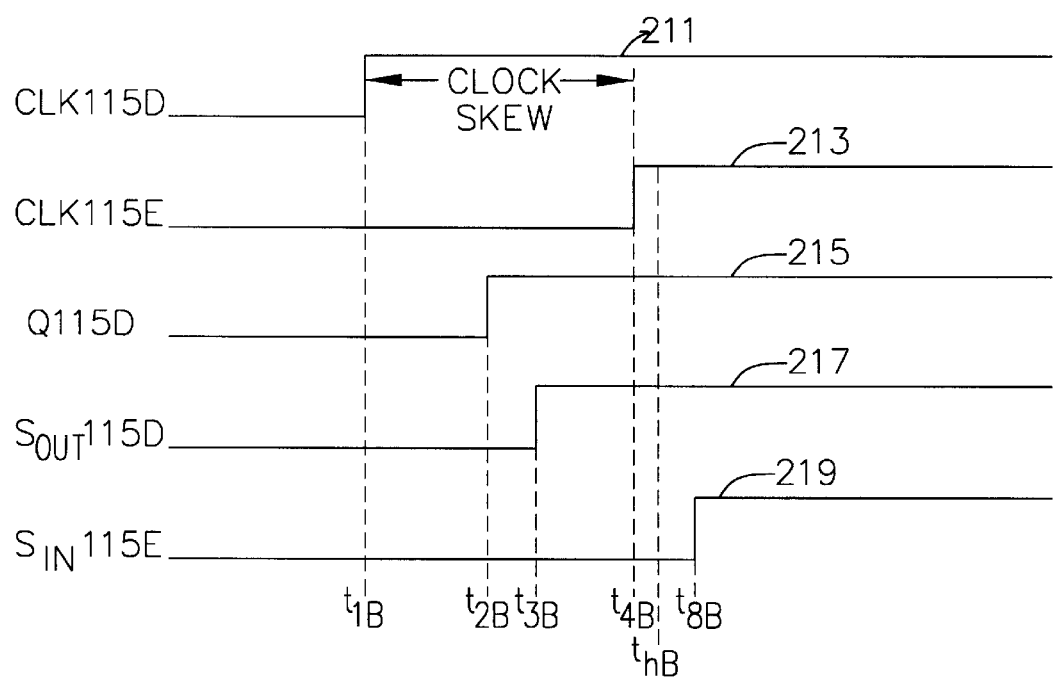
FIG. 6B illustrates a timing diagram of a scan shift operation for two scan flip-flops of the digital logic circuit of FIG. 4.

A timing diagram illustrating a scan shift operation for the circuit of FIG. 4 is shown in FIG. 6B. A clock signal is applied to scan flip-flop 115D at time $t_{1B}$. At time $t_{2B}$, the data input to scan flip-flop 115D propagates through the scan flip-flop 115D and the scan flip-flop Q data driver causes the Q output to transition to the new output value corresponding to the data input value. Due to the weak scan-out signal driver of the scan flip-flop of FIG.2, the delay buffer of the scan flip-flop of FIG.3, or both, the Sut output does not transition to the new output value until time $t_{3B}$. This additional delay results in the $S_{out}$ output signal reaching the $S_{IN}$ input port of scan flip-flop 115E at time $t_{8B}$, which is after both the arrival of the clock signal at scan flip-flop 115E at time $t_{4B}$, and associated hold time expiration at time $t_{hB}$. Thus, a race condition is avoided due to the additional delay provided by the scan flip-flop. Further, a race condition is avoided without modifying normal circuit operation.

Additionally, circuit designers use cell libraries, often indirectly, to construct circuits, with each cell in the cell library representing a circuit element. Generally speaking, circuit designers design circuit operation by using a high level language description such as a hardware description language (HDL), of which Verilog VHDL is an example. The HDL is generally provided to a compiler which creates a net list containing the specific logic components of the circuit and the connections between the components that comprise the circuit. The compiler then utilizes the net list to map specific cells from a cell library to each of the components. The cells represent, or specify, actual circuit elements. Placement of the scan flip-flops of FIGS. 2 and 3, and variations thereof, in cells in the cell libraries allows a circuit designer to select appropriate scan flip-flops during the design phase, and allows the circuit designer to do so with the knowledge that a later formation of scan chains will not affect normal circuit operation. Thus, a synthesis post-process, in which scan candidate flip-flops are identified and replaced with scan flip-flops, may be eliminated from the design process. Additionally, this one-pass scan synthesis process allows a circuit designer to see the timing, power size, and other impacts of scan flip-flops immediately during the design process.

Figure 7:
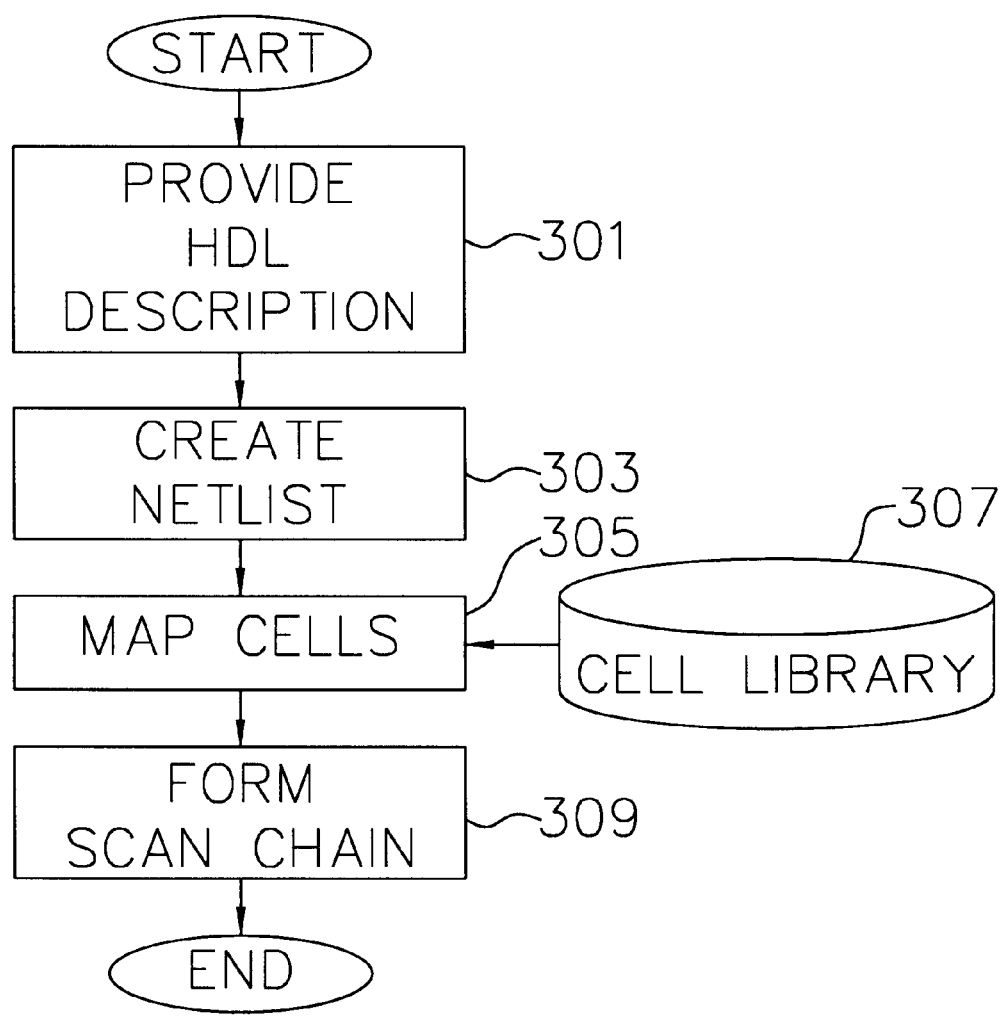
FIG. 7 illustrates a process of creating a digital electronic circuit using a one-pass scan synthesis method of the present invention.

A method of this process is illustrated in FIG. 7. A circuit designer provides an HDL description to an HDL compiler in Step 301. HDL compilers are well known, and are available from companies such as Synopsys, Inc. In Step 303, the HDL compiler generates a generic or unmapped net list. The net list is passed to an optimization and mapping tool, such as Design Compiler by Synopsys, Inc., which maps cells from a cell library 307 to logic components in the net list in Step 305. In Step 309, the scan flip-flops are stitched together to form a scan chain. In some circuit design environments, Steps 303, the creation of the net list, and Step 305, the mapping of cells to logic components, occur in a seamless process, but are described separately herein for the purposes of clarity. Further, the scan chain may also be formed during the creation of the net list or during the mapping of cells to logic components, or both.

Accordingly, the present invention provides a scan flip-flop and methodology which reduce the occurrence of race conditions during scan shift operations as well as improves the design process. Although this invention has been described in certain specific embodiments, many additional modifications and variations, such as the use of a scan flip-flop having separate scan data clock instead of a multiplexer and associated control signal, would be apparent to those skilled in the art. It is therefore to be understood that this invention may be practiced otherwise than is specifically described. Thus, the present embodiments of the invention should be considered in all respects as illustrative and not restricted, the scope of the invention to be indicated by the appended claims rather than the foregoing description.

What is claimed is:

1. A scan flip-flop comprising:
   a data-in signal input, a scan-in signal input, and a test signal input;
   a data-out signal output and a scan-out signal output, the data-out signal output being formed by a data-out signal driver and the scan-out Signal output being formed by a scan-out signal driver, the scan-out signal driver being a weak signal driver; and
   the data-out signal output and the scan-out signal output being coupled to the data-in signal input when the test signal input is provided a signal of a first value, and the data-out signal output and the scan-out signal output being coupled to the scan-in signal input when the test signal input is provided a signal of a second valve.

2. The scan flip-flop of claim 1 wherein the weak signal driver has an input and an output, with the input being the data-out signal output and the output the scan-out signal output.

3. The scan flip-flop of claim 2 wherein the weak signal driver provides a substantially constant load to the data-out signal driver.

4. The scan flip-flop of claim 3 further comprising a circuit element between the data-out signal driver and the weak signal driver, the circuit element providing a substantially constant load to the data-out signal driver.

5. The scan flip-flop of claim 4 wherein the circuit element provides a signal delay.

6. The scan flip-flop of claim 5 wherein the circuit element and the weak signal driver comprise inverters.

7. The scan flip-flop of claim 5 wherein the circuit element comprises at least one inverter and the weak signal driver comprises one of a group of an inverter and a buffer.

8. The scan flip-flop of claim 5 wherein the test signal input comprises a test clock signal.

9. The scan flip-flop of claim 8 further comprising an input clock signal.

10. The scan flip-flop of claim 9 wherein when the input clock signal is set to a first clock value the data-out signal and the scan-out signal are set to the data-in signal, when the input clock signal is set to a second clock value and the test clock signal is set to a first test clock value the data-out signal and the scan-out signal are set to the scan-in signal, and when the input clock signal is not set to the first clock value and the test clock signal is not set to the first test clock value the data-out signal and the scan-out signal do not change values.

11. The scan flip-flop of claim 9 wherein when the input clock signal is set to a first clock value the data-out signal and the scan-out signal are set to the complement of the data-in signal, when the input clock signal is set to a second clock value and the test clock signal is set to a first test clock value the data-out signal and the scan-out signal are set to the complement of the scan-in signal, and when the input clock signal is not set to the first clock value and the test clock signal is not se t to the first test clock value the data-out signal and the scan-out signal do not change values.

12. The scan flip-flop of claim 5 wherein the test signal input comprises a test mode signal.

13. The scan flip-flop of claim 12 further comprising an input clock signal.

14. The scan flip-flop of claim 13 wherein when the input clock signal is set to a first clock value and the test mode signal is set to a TEST value the data-out signal and the scan-out signal are set to the data-in signal, when the input clock signal is set to a first clock value and the test mode signal is set to a $\overline{\text{TEST}}$ value the data-out signal and the scan-out signal are set to the scan-in signal, and when the input clock signal is not set to the first clock value the data-out signal and the scan-out signal do not change.

15. The scan flip-flop of claim 13 wherein when the input clock signal is set to a first clock value and the test mode signal is set to a TEST value the data-out signal and the scan-out signal are set to the complement of the data-in signal, when the input clock signal is set to a first clock value and the test mode signal is set to a TEST value the data-out signal and the scan-out signal are set to the complement of the scan-in signal, and when the input clock signal is not set to the first clock value the data-out signal and the scan-out signal do not change.

16. A scan flip-flop comprising;
   a multiplexer with a data input, a scan input, a control input, and a multiplexer output;
   a transfer gate with a transfer gate input, a transfer gate output, and at least one clock control signal input, the transfer gate input being coupled to the multiplexer output;
   a first latch with a first latch input and a first latch output, the first latch input being coupled to the transfer gate output;
   a data out signal driver with a data out signal driver input and a data output, the data out signal driver input being coupled to the first latch output; and
   a scan out signal driver with a scan out signal driver input and a scan output, the scan out signal driver input being coupled to the data output, and the scan out signal driver being a weak signal driver.

17. The scan flip-flop of claim 16 further comprising:
   a second latch with a second latch input and a second latch output, with the second latch input being coupled to the first latch output and the data-out signal driver input being coupled to the second latch output.

18. A scan flip-flop comprising:
   a multiplexer with a data input, a scan input, a control input, and a multiplexer output;
   a transfer gate with a transfer gate input, a transfer gate output, and at least one clock control signal input, the transfer gate input being coupled to the multiplexer output;
   a latch with a latch input and a latch output, the latch input being coupled to the transfer gate output;
   a data out signal driver with a data out signal driver input and a data output, the data out signal driver input being coupled to the latch output;
   a circuit delay element with a circuit delay element input and a circuit delay element output, the circuit delay element input being coupled to the data out signal driver; and
   a scan out signal driver with a scan out signal driver input and a scan output, the scan out signal driver being a weak signal driver, the scan out signal driver input being coupled to the circuit delay element output.

19. The scan flip-flop of claim 18 wherein the circuit delay element comprises at least one buffer.

20. The scan flip-flop of claim 18 wherein the circuit delay element comprises at least one inverter.

21. The scan flip-flop of claim 18 wherein the circuit delay element comprises simple logic gates.

22. A method of creating a digital electronic circuit design with scan flip-flops comprising:

providing a high level language description representing the digital electronic circuit;

generating a list including logic components and interconnections between the logic components from the high level language description, the list of logic components including a plurality of flip-flop components;

mapping the logic components to cells specifying electronic circuit components, including mapping the flip-flop components to at least one scan flip-flop cell, the scan flip-flop cell specifying a flip-flop element having at least two inputs, a data input and a scan input, and at least two outputs, a data output and a scan output, with the data output driven by a data output signal driver and the scan output driven by a scan output signal driver, the scan output signal driver being a weak signal driver, the scan output signal driver receiving a signal from the data output signal driver, and the scan output signal driver presenting a substantially known load to the data output signal driver; and forming a representation of a scan chain by linking a data output of a first of the plurality of scan flip-flop cells to a scan input of a second of the plurality of scan flip-flop cells.

23. The method of claim 22 wherein the scan flip-flop cell further specifies that the scan output signal driver receives the signal from the data output driver by way of a data output signal driver to scan output signal path, the signal path including at least one circuit delay element.

24. A method using a computer for designing a digital electronic circuit including scan flip-flops forming a scan chain based on a high level language description describing the functions of the digital electronic circuit comprising:

generating a list including logic components and interconnections between the logic components from the high level language description, the list of logic components including a plurality of flip-flop components;

mapping the logic components to cells specifying electronic circuit components, including mapping the flip-flop components to at least one scan flip-flop cell, the scan flip-flop cell specifying a flip-flop element having at least two inputs, a data input and a scan input, and at least two outputs, a data output and a scan output, with the data output driven by a data output signal driver and the scan output driven by a scan output signal driver, the scan output signal driver being a weak signal driver, the scan output signal driver receiving a signal from the data output signal driver, and the scan output signal driver presenting a substantially known load to the data output signal driver; and forming a representation of a scan chain by linking a data output of a first of the plurality of scan flip-flop cells to a scan input of a second of the plurality of scan flip-flop cells.

25. A scan flip-flop comprising:

a data-in signal input, a scan-in signal input, and a test signal input;

a data-out signal output and a scan-out signal output, the data-out signal output being formed by a data-out signal driver and the scan-out signal output being formed by a scan-out signal driver, the scan output signal driver being a weak signal driver;

the data-out signal output and the scan-out signal output being coupled to the data-in signal input when the test signal input is provided a signal of a first value, and the data-out signal output and the scan-out signal output being coupled by a signal path to the scan-in signal input when the test mode input is provided a signal of a second value, with the signal path having delay elements.

26. A scan flip-flop comprising:

a multiplexer with a data input, a scan input, a control input, a circuit delay element, and a multiplexer output, the multiplexer output being linked to the data input when the control input is a first value and the multiplexer output being linked to the circuit delay element, which is linked to the scan input, when the control input is a second value;

a transfer gate with a transfer gate input, a transfer gate output, and at least one clock control signal input, the transfer gate input being coupled to the multiplexer output;

a latch with a latch input and a latch output, the latch input being coupled to the transfer gate output;

a data out signal driver with a data out signal driver input and a data output, the data out signal driver input being coupled to the latch output; and a scan out signal driver with a scan out signal driver input and a scan output, the scan output signal driver being a weak signal driver, the scan out signal driver input being coupled to the latch output.

27. The scan flip-flop of claim 26 further comprising a second latch with a second latch input and a second latch output, with the second latch input being coupled to the latch output and the data-out signal driver input being coupled to the second latch output.

* * * * *

UNITED STATES PATENT AND TRADEMARK OFFICE
CERTIFICATE OF CORRECTION

PATENT NO.    : 6,389,566 B1                                         Page 1 of 1
DATED         : May 14, 2002
INVENTOR(S)   : Kenneth D. Wagner et al.

It is certified that error appears in the above-identified patent and that said Letters Patent is hereby corrected as shown below:

Column 2,
Lines 5, 47 and 60, replace "TEST" with -- TEST --;

Column 5,
Line 2, replace "TEST" with -- TEST --;
Line 58, replace "$t_s$ to the" with -- $t_s$ to $t_h$ --;

Column 7,
Line 41, replace "TEST" with -- TEST --;

Column 8,
Line 7, replace "Sut" with -- $S_{out}$ --;
Line 10, replace "$t_{8B}$" with -- $t_{6B}$ --;
Line 13, replace "$t_{hB}$" with -- $t_{5B}$ --;

Column 9,
Line 9, replace "Signal" with -- signal --;
Line 58, replace "s et " with -- set --;
Line 66, replace "TEST" with -- TEST --;

Column 10,
Line 2, replace "TEST" with -- TEST --;
Line 8, replace replace "TEST" with -- TEST --.

Signed and Sealed this

Fifteenth Day of July, 2003

JAMES E. ROGAN
*Director of the United States Patent and Trademark Office*